US009634695B1

(12) United States Patent
Subrahmaniyan Radhakrishnan et al.

(10) Patent No.: US 9,634,695 B1
(45) Date of Patent: Apr. 25, 2017

(54) WIRELESS DEVICES HAVING MULTIPLE TRANSMIT CHAINS WITH PREDISTORTION CIRCUITRY

(71) Applicant: Apple Inc., Cupertino, CA (US)

(72) Inventors: Gurusubrahmaniyan Subrahmaniyan Radhakrishnan, Theagaraya Nagar (IN); Wassim El-Hassan, Cupertino, CA (US); Srinivasa Yasasvy Sateesh Bhamidipati, Milpitas, CA (US); Hailong Yang, Daly City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/269,805

(22) Filed: Sep. 19, 2016

Related U.S. Application Data

(60) Provisional application No. 62/247,944, filed on Oct. 29, 2015, provisional application No. 62/250,039, filed on Nov. 3, 2015.

(51) Int. Cl.
*H04B 1/04* (2006.01)
*H04W 84/04* (2009.01)

(52) U.S. Cl.
CPC ....... *H04B 1/04* (2013.01); *H04B 2001/0425* (2013.01); *H04W 84/042* (2013.01)

(58) Field of Classification Search
CPC .................. H04B 1/0475; H04B 2001/0425
USPC .... 455/67.11, 67.13, 63.1, 501, 114.3, 114.2
See application file for complete search history.

(56) References Cited

U.S. PATENT DOCUMENTS

| | | | |
|---|---|---|---|
| 7,577,211 B2 | 8/2009 | Braithwaite | |
| 9,258,156 B2 | 2/2016 | Wloczysiak | |
| 9,337,782 B1 | 5/2016 | Mauer et al. | |
| 2004/0057533 A1 | 3/2004 | Kermalli | |
| 2005/0001684 A1* | 1/2005 | Braithwaite | H03F 1/3247 330/263 |
| 2005/0163251 A1* | 7/2005 | McCallister | H03F 1/3247 375/296 |
| 2005/0195919 A1* | 9/2005 | Cova | H03F 1/3258 375/297 |
| 2015/0146765 A1 | 5/2015 | Moffatt et al. | |
| 2015/0381220 A1* | 12/2015 | Gal | H04B 1/0475 375/296 |
| 2016/0072530 A1 | 3/2016 | El-Hassan et al. | |

* cited by examiner

*Primary Examiner* — John J Lee
(74) *Attorney, Agent, or Firm* — Treyz Law Group, P.C.; Michael H. Lyons

(57) ABSTRACT

An electronic device may include wireless communications circuitry that has first and second digital predistortion circuits. The first predistortion circuit receives a first signal at a first frequency while the second predistortion circuit receives a second signal at a second frequency. The first circuit may perform predistortion operations on the first signal using non-unity predistortion coefficients to generate a predistorted signal. The second circuit may apply unity predistortion coefficients to the second signal to generate an undistorted signal. An adder may combine the predistorted and undistorted signals to generate a combined signal that is amplified by amplifier circuitry. An antenna may transmit the amplified signal. By over-distorting the first signal with the first predistortion circuit while the second predistortion circuit does not distort the second signal, the circuitry may mitigate non-linearity in the amplifier while allowing for carrier aggregation operations to be performed with minimal power consumption.

20 Claims, 11 Drawing Sheets

| RGI | BIAS VOLTAGE | BIAS CURRENT | $P_{CELL}$ IQ GAIN | $S_{CELL}$ IQ GAIN | $P_{CELL}$ ENV SCALING | $S_{CELL}$ ENV SCALING | $P_{CELL}$ TX POWER | $S_{CELL}$ TX POWER | DPD COEFFS |
|---|---|---|---|---|---|---|---|---|---|
| RGI1 | V1 | I1 | PIQ1 | SIQ1 | PS1 | SS1 | 20 | 20 | D1 |
| RGI1 | V1 | I1 | PIQ1 | SIQ1 | PS2 | SS1 | 20 | 18 | D2 |
| RGI2 | V2 | I1 | PIQ1 | SIQ1 | PS1 | SS1 | 22 | 20 | D3 |
| RGI2 | V2 | I1 | PIQ1 | SIQ1 | PS3 | SS1 | 22 | 18 | D4 |
| RGI2 | V2 | I1 | PIQ1 | SIQ1 | PS4 | SS1 | 22 | 16 | D5 |
| ... | ... | ... | ... | ... | ... | ... | ... | ... | ... |

| DPD TABLE ENTRY NO | POWER OFFSET (BAND1) | POWER OFFSET (BAND2) | . . . | POWER OFFSET BANDM |
|---|---|---|---|---|
| 1 | -3 | -2 | . . . | -8 |
| 2 | -3 | -3 | . . . | -9 |
| 3 | -3 | -2 | . . . | -7 |
| ⋮ | | | | |

*FIG. 10*

WIRELESS DEVICES HAVING MULTIPLE TRANSMIT CHAINS WITH PREDISTORTION CIRCUITRY

This application claims the benefit of provisional patent application No. 62/247,944, filed Oct. 29, 2015, and provisional patent application No. 62/250,039, filed Nov. 3, 2015, which are hereby incorporated by reference herein in their entireties.

BACKGROUND

This relates generally to electronic devices, and more particularly, to electronic devices with wireless communications capabilities.

Electronic devices with wireless communications capabilities typically include amplifying circuits that are used to amplify the power of radio-frequency signals prior to wireless transmission. For example, a radio-frequency power amplifier may receive input signals having an input power level and generate corresponding output signals having an output power level, where the output power level of the output signal is generally greater than the input power level of the input signal. Ideally, the power amplifier exhibits a perfectly linear input-output power transfer characteristic (i.e., an increase in the input power by a certain amount should result in a corresponding predetermined amount of increase in the output power).

In practice, however, power amplifiers often exhibit non-linear behavior. When a power amplifier is non-linear, an increase in the input power may result in a corresponding increase in the output power that is different than the predetermined amount. Amplifier non-linearity issues can degrade signal integrity and adversely impact wireless performance.

Consumer electronic devices are sometimes configured to support complex, non-constant envelope modulation schemes such as Wideband Code Division Multiple Access (W-CDMA) and Long Term Evolution (LTE) that encode digital data using Orthogonal Frequency-Division Multiplexing (OFDM). High frequency signals generated using such types of radio access technologies can exhibit high peak-to-average ratios (PARs), which places stringent requirements on the linearity of the power amplifier. This increases the power consumption of the power amplifier, which negatively impacts battery life. In order to improve the battery life, it is generally desirable to operate the power amplifiers in the non-linear region.

When radio-frequency power amplifiers are operated in the non-linear region, however, undesired spectral regrowth may be generated that degrades the transmit modulation quality. To reduce this effect, predistortion calibration operations are typically performed to linearize the wireless system. Predistortion calibration involves steps for obtaining amplitude and phase coefficient terms that are used to predistort signals in the modem, which are fed to the transceiver for digital to high frequency RF conversion. This ensures satisfactory transmit quality without compromising on efficiency. In systems having a constrained bandwidth, it can be difficult to operate the system under full transmit bandwidth conditions.

It would therefore be desirable to be able to provide improved ways for computing and using predistortion coefficient values in wireless systems.

SUMMARY

An electronic device may be provided with wireless communications circuitry and storage and processing circuitry. The wireless communications circuitry may include first and second transmit chains, adder circuitry, up-converter circuitry, digital-to-analog converter circuitry, amplifier circuitry, and antenna circuitry. The first transmit chain may include a first baseband processor and a first digital predistortion circuit whereas the second transmit chain includes a second baseband processor and a second digital predistortion circuit.

The first baseband processor may generate a first signal at a first frequency and the second baseband processor may generate a second signal at a second frequency that both include data from the same data stream (e.g., for performing carrier aggregation operations). The first digital predistortion circuit may perform predistortion operations on the first signal over a first fixed bandwidth using a set of non-unity predistortion coefficients to generate a predistorted signal. The second digital predistortion circuit may apply unity predistortion coefficients to the second signal to generate an undistorted signal (e.g., the second digital predistortion circuit may perform no predistortion or unity predistortion). The adder circuitry may combine the predistorted signal and the undistorted signal to generate a combined signal. The amplifier circuitry may amplify the combined signal to generate an amplified signal. The predistortion operations may mitigate any non-linearity in the amplifier circuitry. The amplified signal may have a bandwidth that is greater than the first and second fixed bandwidths. The antenna may transmit the amplified signal.

Storage and processing circuitry on the device may maintain calibration data (e.g., on non-volatile memory). The calibration data may identify the non-unity predistortion coefficients. The processing circuitry may identify a first power level of the first signal and a second power level of the second signal. The processing circuitry may generate a total power level by adding an offset value to the first power level. The processing circuitry may identify settings in the calibration data for the wireless communications circuitry to use in signal transmission based on the total power level and the second power level. The electronic device may generate the calibration data during calibration operations, if desired.

The processing circuitry may determine whether the first power level is greater than the second power level. If the first power level is greater than the second power level, the processing circuitry may control the first predistortion circuit to generate the predistorted signal by providing the first set of non-unity predistortion coefficients to the first predistortion circuit. If the first power level is less than the second power level, the processing circuitry may control the second predistortion circuit to generate the predistorted signal by providing the first set of non-unity predistortion coefficients to the second predistortion circuit while the first predistortion circuit applies a unity predistortion. The amplifier may be characterized by a transfer function. The non-unity predistortion coefficients may control the predistortion circuit to exhibit a predistortion transfer function that is equal to two minus the transfer function divided by the transfer function, as an example.

In this way, one of the predistortion circuits may over distort the signal along a first transmit chain while the other predistortion circuit does not distort the signal along a second transmit chain. This may consume less total power relative to scenarios where the signals from both transmit chains are added prior to predistortion, for example.

BRIEF DESCRIPTION OF THE DRAWINGS

FIG. 9 is a diagram of illustrative calibration data that may be stored on an electronic device for use in transmitting uplink signals in accordance with an embodiment.

FIG. 10 is a diagram of illustrative power offset calibration data that may be stored on an electronic device for compensating for performance variations across different frequencies while transmitting uplink signals in accordance with an embodiment.

DETAILED DESCRIPTION

This relates generally to electronic devices, and more particularly, to electronic devices having wireless communications capabilities.

Figure 1:
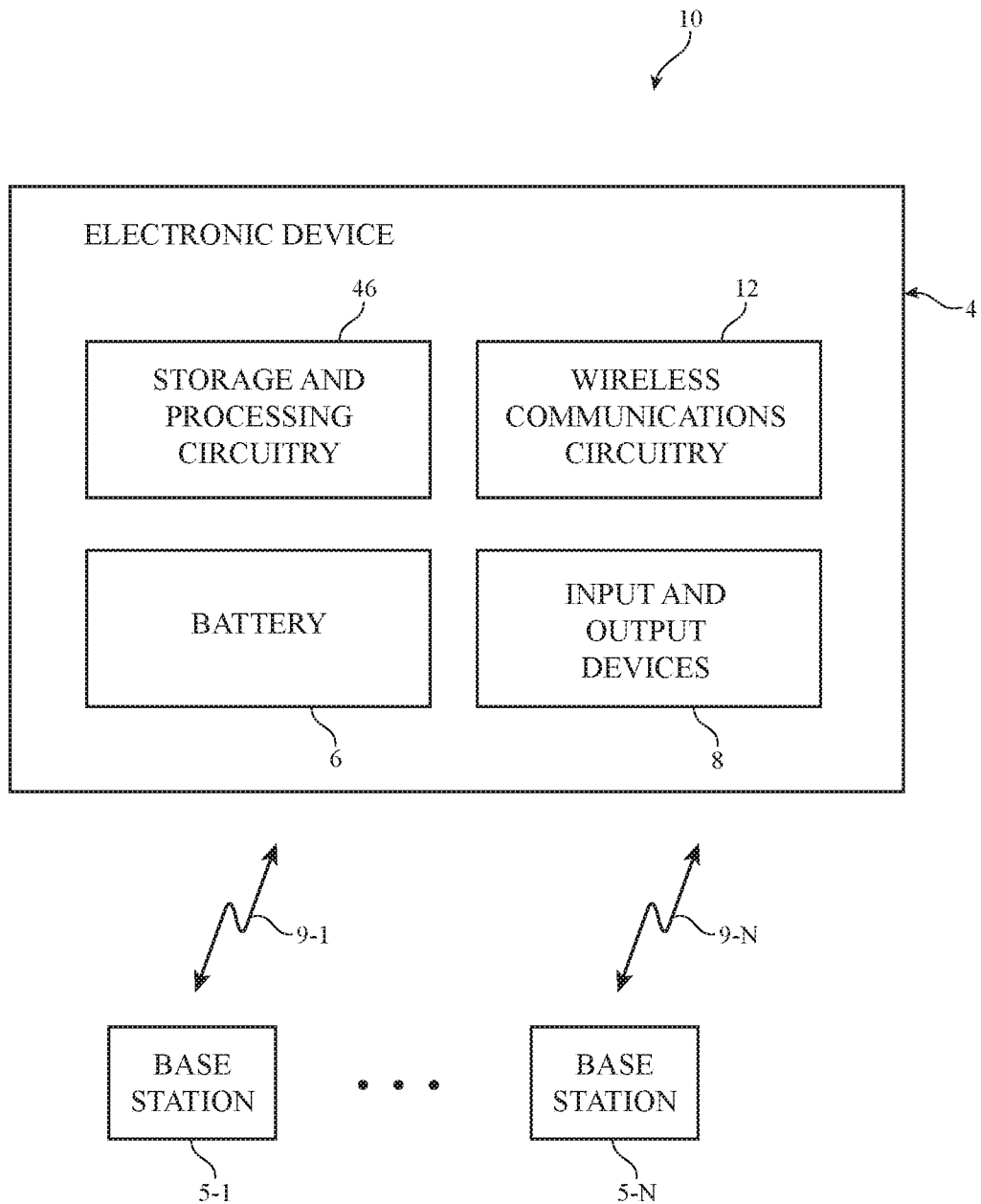
FIG. 1 is a diagram of an illustrative electronic device with wireless communications circuitry for wirelessly communicating with multiple external devices in accordance with an embodiment.

An illustrative wireless electronic device is shown in FIG. 1. Wireless electronic device 10 of FIG. 1 may be a cellular telephone, a tablet computer, a laptop computer, a desktop computer, a personal computer, a portable media player, a handheld computer (also sometimes called personal digital assistants), a remote controllers, a global positioning system (GPS) device, a handheld gaming device, other miniature and portable devices, or other electronic equipment. Wireless electronic devices such as these may perform multiple functions if desired. For example, a cellular telephone may include media player functionality and may have the ability to run games, email applications, web browsing applications, and other software.

As shown in FIG. 1, device 10 may include storage and processing circuitry 46. Storage and processing circuitry 46 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 46 may be used in controlling the operation of device 10. Processing circuitry in circuitry 46 may be based on processors such as microprocessors, microcontrollers, digital signal processors, dedicated processing circuits, power management circuits, audio and video chips, radio-frequency transceiver processing circuits, radio-frequency integrated circuits of the type that are sometimes referred to as baseband modules, and other suitable integrated circuits.

Storage and processing circuitry 46 may be used to run software on device 10, such as internet browsing applications, voice-over-internet-protocol (VOIP) telephone call applications, email applications, media playback applications, operating system functions, etc. Storage and processing circuitry 46 may be used in implementing suitable communications protocols. Communications protocols that may be implemented using wireless communications circuitry 12 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 46 and/or input-output devices 8).

Device 10 may have one or more batteries such as battery 6. To minimize power consumption and thereby extend the life of battery 6, storage and processing circuitry 46 may be used in implementing power management functions for device 10. For example, storage and processing circuitry 46 may be used to adjust the power supply voltages that are used in powering the radio-frequency power amplifier circuitry. Whenever possible, these power amplifier bias voltages may be reduced to conserve power. If desired, storage and processing circuitry 46 may also be used to adjust the gain state of radio-frequency power amplifier circuitry on device 10 and may be used in adjusting the gain of a variable gain amplifier (VGA) that feeds output signals to the power amplifier circuitry. These adjustments may be made automatically in real time based on calibration data (sometimes referred to as calibration table data) stored on storage and processing circuitry 46 and control algorithms (software). For example, code may be stored in storage and processing circuitry 46 that configures storage and processing circuitry 46 to implement a control scheme in which operating settings are adjusted in accordance with calibration data to satisfy desired performance criteria such as desired transmit power levels, receive band noise levels, and adjacent channel leakage values while minimizing power consumption.

Input-output devices 8 may be used to allow data to be supplied to device 10 and to allow data to be provided from device 10 to external devices. Examples of input-output devices 8 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through input-output devices 8. Input-output devices 8 may also be used to convey visual or sonic information to the user of device 10. Input-output devices 8 may include connectors for forming data ports (e.g., for attaching external equipment such as computers, accessories, etc.).

Wireless communications circuitry 12 may include communications circuitry such as radio-frequency (RF) transceiver circuitry formed from one or more integrated circuits, power amplifier circuitry (e.g., power amplifier circuitry that is controlled by control signals from storage and processing circuitry 46 or other power supply circuitry to minimize power consumption while satisfying desired performance criteria), passive RF components, antennas, and other circuitry for handling RF wireless signals. Wireless signals can also be sent using light (e.g., using infrared communications).

Device 10 can communicate with external devices such as accessories, computing equipment, and wireless networks over wired and wireless communications paths. For example, device 10 may communicate with wireless network equipment such as one or more cellular telephone base stations 5 over corresponding wireless links 9. In the example of FIG. 1, one or more of antennas in wireless communications circuitry 12 may communicate with a first base station 5-1 over a first communications link 9-1, may communicate with a second base station 5-N over a second communications link 9-N, or may simultaneously communicate with base stations 5-1 and 5-N over both communications links 9-1 and 9-N, respectively. In one suitable arrangement, wireless communications circuitry 12 may simultaneously convey information with first base station 5-1 in a first communications band associated with link 9-1 and second base station 5-N in a second communications band associated with link 9-N in a scheme sometimes referred to as carrier aggregation.

When operating using a carrier aggregation scheme, the first base station 5 with which device 10 establishes a corresponding wireless link 9 may sometimes be referred to herein as a Primary Component Carrier (PCC) or primary base station. Radio-frequency signals conveyed between the primary base station and device 10 may sometimes be referred to herein as primary component carrier signals, primary signals, primary component signals, primary carrier signals, or PCC signals, and the wireless link 9 between the primary base station and device 10 may sometimes be referred to herein as a primary connection or primary wireless link. Once a connection is established between device 10 and the primary base station, device 10 may establish an additional wireless connection with another base station 5 without dropping the connection with the primary base station, and may simultaneously communicate with both base stations (e.g., using different frequency bands in a carrier aggregation scheme). Additional base stations that establish a connection with device 10 after device 10 has established a wireless connection with a primary base station may sometimes be referred to herein as Secondary Component Carriers (SCCs) or secondary base stations. Radio-frequency signals conveyed between the secondary base station and device 10 may sometimes be referred to herein as secondary component carrier signals, secondary signals, secondary component signals, secondary carrier signals, or SCC signals, and the wireless link 9 between the secondary base station and device 10 may sometimes be referred to herein as secondary connections or secondary wireless links.

Device 10 may establish a connection with a primary base station and one or more secondary base stations in downlink and uplink communications bands if desired.

The components of device 10 may be enclosed within a housing such as housing 4. Housing 4, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 4 may be formed using a unibody configuration in which some or all of housing 4 is machined or molded as a single structure or may be formed using multiple structures (e.g., an internal frame structure, one or more structures that form exterior housing surfaces, etc.).

Figure 2:
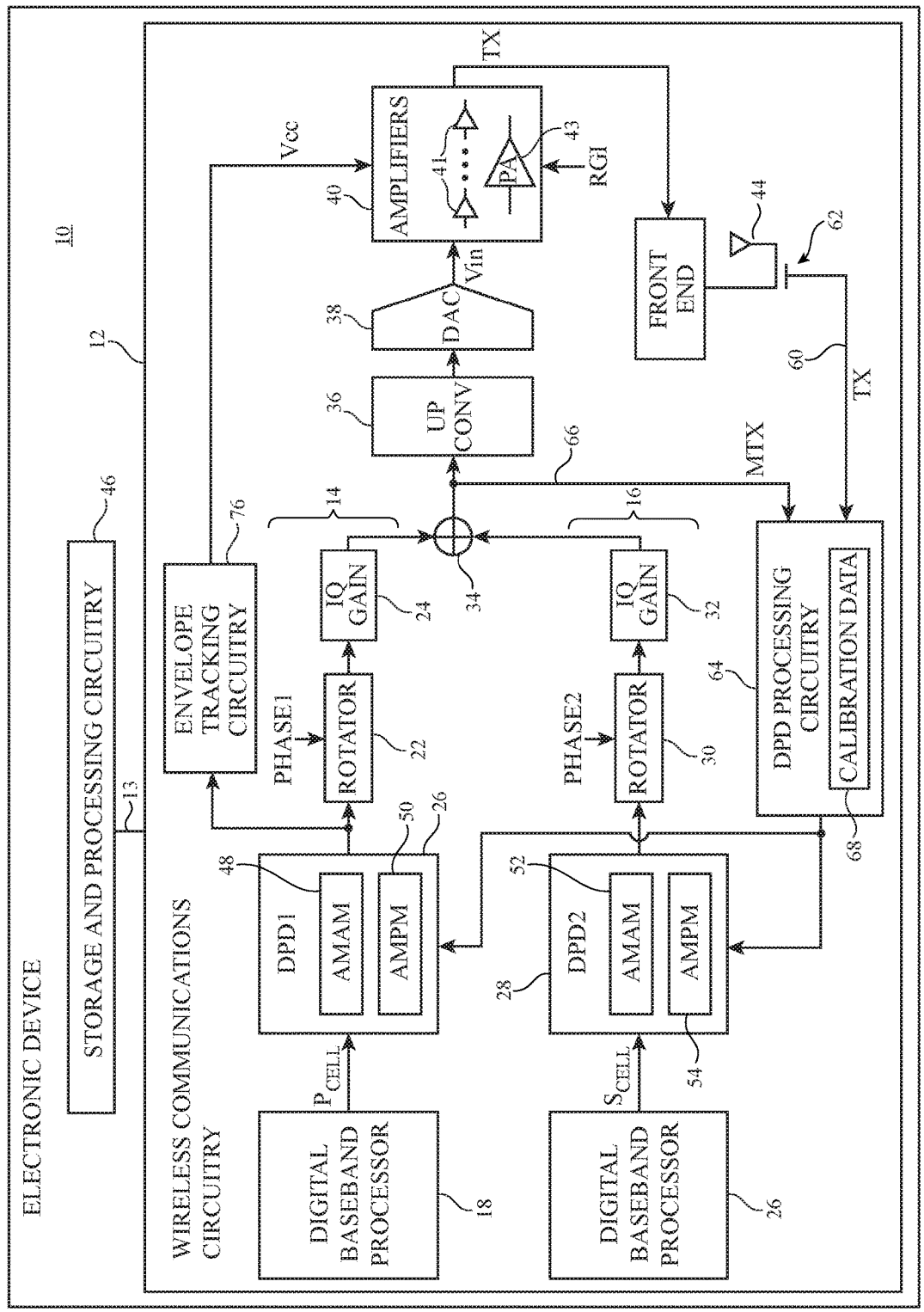
FIG. 2 is a circuit diagram showing how illustrative wireless communications circuitry in an electronic device may include multiple transmit chains with digital predistortion circuitry in accordance with an embodiment.

FIG. 2 is a circuit diagram of illustrative wireless communications circuitry 12 within device 10. Wireless communications circuitry 12 may include transmit bandwidth constrained wireless circuitry (e.g., circuitry for transmitting radio-frequency signals having constrained bandwidths). The bandwidth constrained wireless circuitry may include two or more independent transmit chains that are combined in the digital domain (e.g., prior to conversion to an analog domain for wireless transmission).

As shown in FIG. 2, wireless circuitry 12 may include a first transmit chain 14 and a second transmit chain 16. First transmit chain 14 may include baseband circuitry such as first digital baseband processor 18, digital predistortion (DPD) circuitry 20, and post DPD processing circuitry such as rotator circuit 22 and IQ gain circuitry 24. Circuits 22 and 24 may, if desired, be formed as a part of DPD circuitry 20. Second transmit chain 16 may include baseband circuitry such as second digital baseband processor 26, DPD circuitry 28, and post DPD processing circuitry such as rotator circuit 30 and IQ gain circuitry 32. Circuits 30 and 32 may, if desired, be formed as part of DPD circuitry 28.

Wireless circuitry 12 may include conversion circuitry such as an up-converter circuitry 36 and a digital-to-analog converter (DAC) 38. Wireless circuitry 12 may include amplifying circuitry such as amplifier circuitry 40, front end circuitry 42, and one or more antennas such as antenna 44. The example of FIG. 2 shows only circuitry in the transmit (Tx) path of wireless circuitry 12 for the sake of clarity. In general, wireless communications circuitry 12 may also include processing circuitry in the receive (Rx) path such as a low noise amplifier, a down converter, an analog-to-digital converter (ADC), an impedance matching circuit, and other associated control circuitry. Wireless circuitry 12 may include any other desired transmission line structures, switching structures, filtering structures, tuning structures, matching structures, or any other desired baseband or radio-frequency circuitry.

The antenna structures 44 and wireless communications devices of device 10 may support communications over any suitable wireless communications bands. For example, wireless communications circuitry 18 may be used to cover communications frequency bands such as cellular telephone voice and data bands at 850 MHz, 900 MHz, 1800 MHz, 1900 MHz, 2100 MHz, the Wi-Fi® (IEEE 802.11) bands at 2.4 GHz and 5.0 GHz (also sometimes referred to as wireless local area network or WLAN bands), the Bluetooth® band at 2.4 GHz, the global positioning system (GPS) band at 1575.42 MHz, etc. Antennas 44 may be formed using any suitable antenna types. For example, antennas 44 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna. While only one antenna 44 is shown in the example of FIG. 2, in general, any desired number of antennas may be formed.

Data signals that are to be transmitted by device 10 may be provided to baseband processors 18 and 26 (e.g., from storage and processing circuitry 46). Baseband processors 18 and 26 may each be implemented using a respective single integrated circuit (e.g., a baseband processor integrated circuit) or using multiple integrated circuits. Processors 18 and 26 may, if desired, be formed on a common (shared) integrated circuit. Baseband processors 18 and 26 may receive signals to be transmitted over path 13 from storage and processing circuitry 46. Baseband processors 18 and 26 may receive signals from antenna 44 over one or more receive paths (not shown). The digital baseband processors 18 and 26 may, for example, serve as an I/Q generator that outputs I and Q samples (e.g., sometimes referred to as "in-phase data" and "quadrature data," respectively).

Baseband processors 18 and 26 may provide signals at different respective frequencies. In one example that is sometimes described herein as an example, wireless communications circuitry may handle radio-frequency signals that are simultaneously received and/or transmitted in multiple frequency bands. For example, the wireless communications circuitry may handle data streams that are simultaneously transmitted to multiple wireless base stations 5 (e.g., using a carrier aggregation scheme). This may allow for the wireless communications circuitry to have improved data throughput relative to devices that receive signals only over a single frequency band. In this example, the same data stream may, for example, be conveyed over a primary frequency (sometimes referred to herein as a $P_{CELL}$ frequency) and a secondary frequency (sometimes referred to herein as an $S_{CELL}$ frequency) that is different from the primary frequency. The primary frequency may be used for communicating with the primary base station 5 whereas the secondary frequency may be used for communicating with the secondary base station 5, for example.

When operating under a carrier aggregation scheme, first processor 18 may provide signals $P_{CELL}$ at the primary frequency whereas second processor 26 provides signals $S_{CELL}$ at the secondary frequency. Signals $P_{CELL}$ and $S_{CELL}$ may represent the same data stream, if desired, but are provided at different frequencies for simultaneous uplink to one or more external devices (e.g., base stations 5). Primary signals $P_{CELL}$ may be provided by baseband processor 18 at a first transmit power level PCELLTX whereas secondary signals $S_{CELL}$ may be provided by baseband processor 26 at a second transmit power level SCELLTX. Signals $P_{CELL}$ and $S_{CELL}$ may include IQ samples that are received at DPD circuits 20 and 28, respectively.

Digital predistortion circuitry 20 and 28 may receive the IQ samples and optionally convert the IQ samples from the I-Q coordinate plane into an equivalent representation in the polar coordinate plane. Once the IQ samples have been converted into the polar coordinate system in which the magnitude of the signals corresponds to the amplitude of the signal to be transmitted and in which the angle of the signals corresponds to the phase of the signal to be transmitted, circuitry 20 and 28 may predistort the converted signals according to a predetermined set of predistortion coefficients.

In the example of FIG. 2, the amplitude of the transmitted signals may be altered according to an amplitude modulation predistortion coefficient value (sometimes referred to as the "AMAM" value), whereas the phase of the transmitted signals may be altered according to a phase modulation predistortion coefficient value (sometimes referred to as the "AMPM" value). First DPD circuit 20 (sometimes referred to herein as primary DPD circuit 20 or "DPD1") may perform predistortion on signals $P_{CELL}$ received from baseband 18 using a first set of AMAM coefficients 48 and a first set of AMPM coefficients 50. Second DPD circuit 28 (sometimes referred to herein as "DPD2") may perform predistortion on received signals $S_{CELL}$ using a second set of AMAM coefficients 52 and a second set of AMPM coefficients 54.

Predistorted signals may be output by DPD circuitry 20 and provided to rotator 22. Rotator 22 may receive a control signal PHASE1 (e.g., from control circuitry 46) that controls rotator 22 to rotate the predistorted signals by a corresponding phase. The rotated signals may be provided to IQ gain circuitry 24. IQ gain circuitry 24 may apply a desired IQ gain to the signals (sometimes referred to herein as a $P_{CELL}$ IQ gain setting). Similarly, predistorted signals may be output by DPD circuitry 28 and provided to rotator 30. Rotator 30 may receive a control signal PHASE2 (e.g., from control circuitry 46) that controls rotator 30 to rotate the predistorted signals by a corresponding phase. The rotated signals may be provided to IQ gain circuitry 32. IQ gain circuitry 32 may apply a desired IQ gain to the signals (sometimes referred to herein as an $S_{CELL}$ IQ gain setting). The IQ gain settings may serve as a tuning knob for adjusting the transmission of signals using circuitry 12. IQ gain circuitry 24 and 32 may provide the corresponding predistorted signals to adder circuitry 34. Adder circuitry 34 may combine the signals and provide the combined signals to up-conversion circuitry 36.

Up-conversion circuitry 36 may serve to up-convert the predistorted signals from baseband to radio frequencies. Up-converter circuitry 36 may then pass the up-converted and predistorted signals to DAC 38. Converter 38 may be configured to perform digital-to-analog conversion on the digital predistorted signals and may pass an analog version of the predistorted signals to amplifier circuitry 40. The example of FIG. 2 is merely illustrative. If desired, DAC 38 may be coupled to the input of up-conversion circuitry 36.

Amplifier circuitry 40 may include a driver amplifier having one or more amplifier stages such as stages 41. As an example, amplifiers 40 may include three series-connected driver amplifier stages 41. One or more control signals from storage and processing circuitry 46 may be used to selectively enable and disable stages 41 or to control the gain of individual stages. Enabling and disabling stages 41 selectively and/or adjusting the gain of individual stages separately may place the driver amplifier into different power modes. For example, the driver amplifier may be placed into a high power mode (sometimes referred to as high gain mode) by enabling all three of driver amplifier stages 41 or may be placed into a low power mode (sometimes referred to as low gain mode) by enabling only two of the driver amplifier stages 41. Other configurations may be used if desired.

In one suitable embodiment of the present invention, the gain of the driver amplifier in circuitry 40 may be fine-tuned by adjusting a radio-frequency gain index (RGI) of amplifier circuitry 40. Incrementing the gain index may, for example, increase the amount of bias current that is provided to one or more of the stages to increase the gain and/or maximum power output of the driver amplifier. Radio-frequency gain index control signal RGI may therefore serve as one of the available tuning knobs for adjusting the gain of the transmit path.

The driver amplifier in circuitry 40 may provide amplified signals to a power amplifier 43 (e.g., via matched filter circuitry). The matched filter circuitry may include a network of passive components such as resistors, inductors, and/or capacitors and to filter out interference signals at unwanted frequencies. During data transmission, power amplifier circuitry 43 may boost the output power of transmitted signals to a sufficiently high level to ensure adequate signal transmission at antenna structures 44. The example of FIG. 2 in which driver amplifiers 41 and power amplifier 43 are shown as separate components is merely illustrative. In other arrangements, driver amplifier 41 may sometimes be considered to be part of power amplifier 43.

Control circuitry such as circuitry 46 may be used to adjust the level of bias voltage Vcc (e.g., sometimes referred to herein as power supply voltage Vcc or power amplifier bias voltage Vcc) provided to amplifier circuitry 40. If desired, control circuitry 46 or other circuitry may adjust a bias current provided to amplifier circuitry 40. Bias voltage Vcc may be used as a power supply voltage for one or more active power amplifier stages in power amplifier circuitry 40 (e.g., for stages 41 and/or amplifier 43).

Amplified signals TX may be output by circuitry 40 to radio-frequency front end circuitry 42. Front end 42 may include passive components such as resistors, inductors, and/or capacitors that are configured to ensure that the antenna structures 44 are impedance matched to the rest of the wireless communications circuitry (e.g., to ensure maximum power transfer via antenna 44) and to filter out interference signals generated at unwanted frequencies. Circuitry 42 may also include filters such as a radio-frequency duplexer and other radio-frequency output stage circuitry such as radio-frequency switches and passive elements. Switches may, if desired, be used to switch the wireless circuitry between a transmitting mode and a receiving mode. A duplexer may be used to route input and output signals based on their frequency. The example of FIG. 2 is merely illustrative. If desired, circuitry 42 may be omitted or formed as a part of circuitry 40.

Antenna 44 may transmit the radio-frequency signals TX to external equipment such one or more base stations 5 (e.g., a primary base station 5 and a secondary base station 5). In general, any suitable antenna structures may be used in device 10. For example, device 10 may have one antenna or may have multiple antennas. Antenna(s) 44 in device 10 may each be used to cover a single communications band or each antenna may cover multiple communications bands. If desired, one or more antennas may cover a single band while one or more additional antennas are each used to cover multiple bands.

The output of front end circuitry 42 may be coupled to a feedback path 60 via coupling circuitry such as radio-frequency coupler 62. If desired, coupler 62 may be coupled to the output of amplifier circuitry 40 or to a portion of amplifier circuitry 40. Feedback path 60 may convey radio-frequency transmit signals TX amplified by power amplifier circuitry 40 to processing circuitry 64 (sometimes referred to herein as DPD processing circuitry 64). If desired, circuitry 64 may process the transmit signals received over feedback path 60 to calibrate the radio-frequency performance of power amplifier circuitry 40. Processing circuitry 64 may receive added signals MTX from the output of adder circuitry 34 over path 66. Circuitry 64 may generate predistortion coefficients 48, 50, 52, and/or 54 by comparing added signals MTX to amplified signals TX. Circuitry 64 may store the generated predistortion coefficients as a portion of calibration data 68. Calibration data 68 may include other settings (e.g., settings for so-called "tuning knobs") associated with the transmission of uplink signals using circuitry 12.

Processing circuitry 64 may use calibration data 68 in performing transmission with circuitry 12. For example, circuitry 64 may configure circuitry 12 based on calibration data 68 for signal transmission. Circuitry 64 may provide DPD coefficients from calibration data 68 to circuits 20 and 28 for use in predistorting transmit signals. Calibration data 68 may be generated by device 10 (e.g., while operating in a calibration system). For example, calibration software running on circuitry 46 and/or external devices may direct device 10 to perform power amplifier calibration operations in a calibration system for use during normal operation by an end user. Portions of calibration data 68 may serve as actual configuration data for device 10 (e.g., when the settings are loaded or applied) during user operation and may therefore be written in non-volatile memory (NVM) on device 10 (e.g., in circuitry 64 or 46).

As device 10 is operated in a cellular network or other wireless communications network, the amount of power that is transmitted by wireless circuitry 12 (e.g., output power level of signals TX) is typically adjusted up and down in real time. For example, if a user is in the vicinity of a cellular tower, the cellular tower may issue a command that instructs device 10 to reduce its transmitted power level (output power level). If a user travels farther away from the tower, the tower may issue a TPC command that requests an increase in transmitted power.

The gain of power amplifier circuitry 40 may be adjusted to conserve power while ensuring that required amounts of output power can be satisfactorily produced. For example, when transmitted power requirements are modest, a lower bias voltage Vcc may be provided to amplifier circuitry 40 to conserve power. However, the magnitude of Vcc can affect power amplifier linearity (e.g., particularly in scenarios where input voltage Vin is relatively high). Nonlinearities can result in signal distortion and adverse effects such as increases in adjacent channel leakage or generation of signal power at harmonic frequencies of the transmit frequency with which transmit signals TX are transmitted by circuitry 12. For example, an amplifier will generally exhibit more adjacent channel leakage (sometimes referred to as adjacent channel leakage ratio or adjacent channel power) at a given output power when operated at a relatively low bias voltage than when operated at relatively high bias voltage. Nevertheless, maximum Vcc levels are generally only required when it is desired to maximize power amplifier linearity. When less power amplifier linearity is tolerable, the magnitude of Vcc can be reduced. Because operation with lowered Vcc settings can reduce power consumption, device 10 preferably reduces Vcc from its nominal maximum level whenever possible.

When controlling the operation of wireless circuitry 18 in this way to conserve power, care should be taken that relevant operating criteria are being satisfied. For example, a wireless carrier or other entity may require that a cellular telephone meet certain minimum standards when operating in the network of the wireless carrier. A carrier may, for example, establish required limits on adjacent channel leakage. Devices that allow too much adjacent channel leakage will not be permitted to operate in the carrier's network. Power can be conserved by backing Vcc off from its nominal maximum value, but only so long as this decrease in power amplifier bias does not cause adjacent channel leakage violations, generate undesirable harmonics, or cause other performance criteria to be violated. In general, higher bias voltages Vcc may be required to amplify transmit signals at higher input voltages Vin than transmit signals at lower input voltages Vin in order to ensure suitably low harmonic contributions generated by amplifier 40 for both the higher and lower input voltages.

If desired, wireless circuitry 12 may include envelope tracking circuitry 70 that (continuously) adjusts the bias voltage Vcc provided to amplifier circuitry 40 in real time using a so-called "envelope tracking" process. Envelope tacking circuitry 70 may receive the predistorted output of DPD circuitry 20 and may use the output to generate bias voltage Vcc. By performing envelope tracking, circuitry 70 may continuously adjust the power supply voltage Vcc provided to amplifier 40 up and down based on the magnitude of signals $P_{CELL}$. The example of FIG. 2 is merely illustrative. If desired, envelope tracking circuitry 70 may additionally or alternatively be coupled to the output of second DPD circuit 28 for adjusting Vcc based on the magnitude of signals $S_{CELL}$. Circuitry 70 may apply a desired delay to voltage Vcc. The desired delay may serve as one of the tuning knobs for adjusting the transmit path. If desired, envelope tracking circuitry 70 may provide bias voltage Vcc at a series of fixed voltages for the sake of simplicity. In another suitable arrangement, envelope tracking circuitry 70 may be omitted.

Due to non-idealities associated with radio-frequency amplifier 40, the signals produced at the output of amplifier 40 are not only amplified but are also distorted by non-linear power transfer characteristics of amplifier 40. If predistortion circuitry 20 and 28 are properly set (e.g., using properly calibrated predistortion coefficients AMAM and AMPM), signals generated at the output of amplifier 40 will produce a frequency response that is substantially similar to that of the desired frequency response of the original signal prior to predistortion and amplification. In general, predistortion circuitry 20 and 28 can be used to correct for any undesired magnitude and phase deviations associated with amplifier 40, thereby improving power amplifier efficiency and wireless performance.

Figure 3:
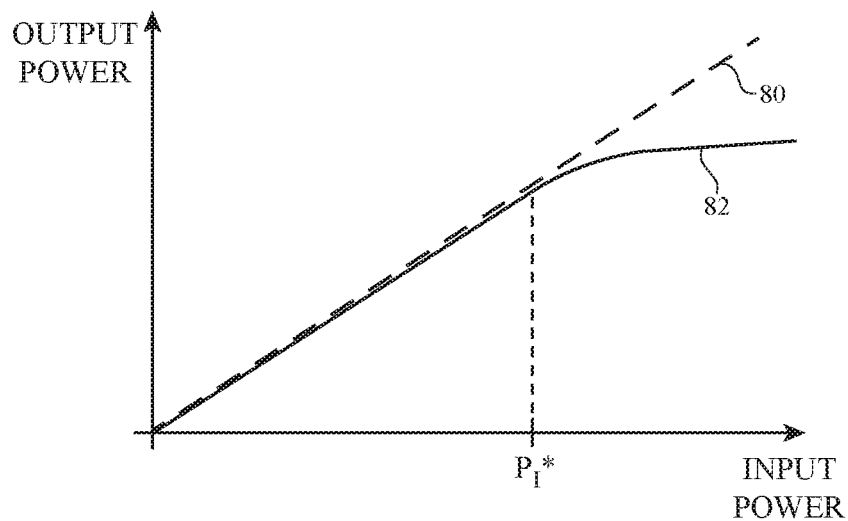
FIG. 3 is an exemplary diagram plotting output power level versus input power level of an illustrative radio-frequency power amplifier in accordance with an embodiment.

Ideally, radio-frequency amplifier circuitry 40 exhibits a perfectly linear power response. FIG. 3 plots output power level versus input power level for an illustrative radio-frequency power amplifier. Response line 80 may represent an ideal power characteristic, whereas line 82 may represent an actual power characteristic of the power amplifier in practice. As shown in FIG. 3, line 80 may have a constant slope across all input power levels (i.e., any increase in input power results in a corresponding increase in output power by a predetermined amount).

It is, however, challenging to manufacture power amplifiers that exhibit perfectly linear power transfer characteristics. In practice, increases in input power levels may not always increase the output power by the predetermined amount. As shown by line 82 in FIG. 3, the slope of line 82 may deviate from the desired slope of line 80 after a certain power level $P_I^*$. This undesired deviation may result in a reduction in the gain provided by the power amplifier at input power levels greater than $P_I^*$ and may therefore sometimes be referred to as gain compression. In general, radio-frequency power amplifier 40 in device 10 may exhibit gain compression and/or may deviate from the ideal transfer characteristic in any other way.

Figure 4:
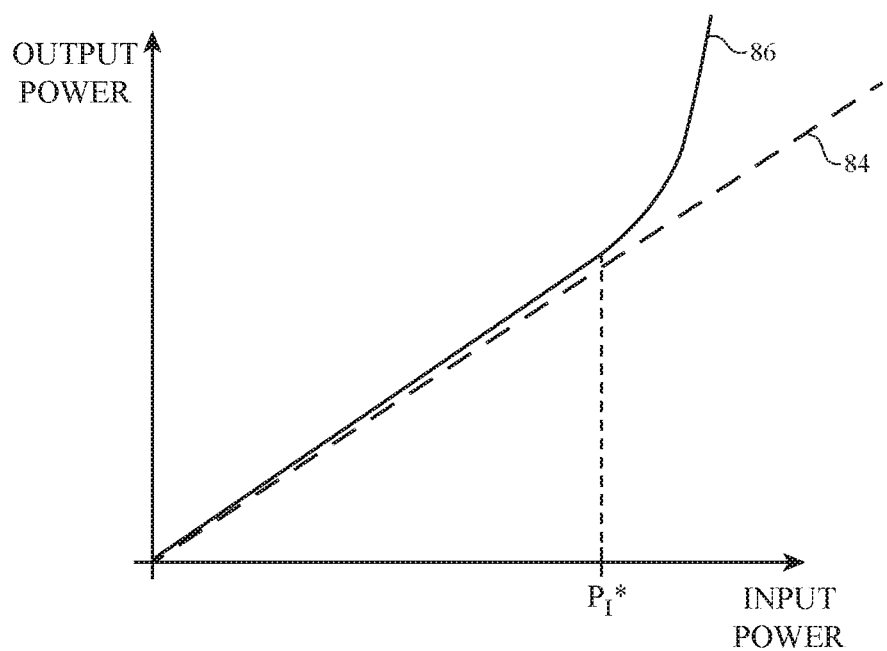
FIG. 4 is an exemplary diagram plotting output power level versus input power level of illustrative digital predistortion circuitry in accordance with an embodiment.

As described above in connection with FIG. 2, predistortion circuitry 20 and 28 may be used to introduce signal distortion that compensates for undesired deviation(s) from the ideal power transfer characteristic (e.g., to counteract any undesirable non-linear behavior associated with power amplifier 40). FIG. 4 plots output power level versus input power level for an exemplary predistortion circuit. Line 84 may exhibit a constant slope of one, whereas line 86 may exhibit the actual power characteristic of the predistortion circuit. For all signals that are received by the predistortion circuitry and that have power levels less than or equal to $P_I^*$, these signals may be passed through to the output of the predistortion circuit without any amplification nor attenuation. For all signals that are received with the predistortion circuit and that have power levels greater than $P_I^*$, these signals may be provided with an appropriate amount of gain to compensate for the gain compression associated with the power amplifier as described in connection with FIG. 3.

Line 86 of FIG. 4 is merely illustrative. In general, predistortion circuitry 20 and 28 may exhibit a power transfer curve having an inverse relationship with respect to the input-output transfer characteristic associated with power amplifier 40 (e.g., a positive deviation in line 82 from line 80 at a given first input power level may be accompanied by a negative deviation in line 86 from line 84 at the given first input power level, whereas a negative deviation in line 82 from line 80 at a given second input power level may be accompanied by a positive deviation in line 86 from line 84 at the given second input power level).

Wireless communications circuitry 12 may be a bandwidth constrained system that is configured to handle transmit signals having predetermined bandwidth. First DPD circuit 20 may operate at a fixed signal bandwidth (e.g., 20 MHz). Similarly, second DPD circuit 28 may operate at a fixed signal bandwidth such as 20 MHz. However, the output signal TX may have a full constrained bandwidth such as 40 MHz. In order to provide predistortion over the full bandwidth of the output, DPD circuits 20 and 28 may perform separate 20 MHz bandwidth distortions to approximate the effects of predistorting the full 40 MHz bandwidth of the output signal. In practice, performing significant amounts of distortion using two separate DPDs can consume excessive power in the electronic device. In order to improve power performance of the system, one of DPD circuits 20 and 28 may apply no distortion (e.g., using DPD coefficients set to unity) while the other circuit over-distorts the corresponding signal. The sum total of the operation of both DPD circuits (in addition to the appropriate selection of corresponding transmit settings) in this scenario may sufficiently approximate distortion over the full 40 MHz signal bandwidth (while consuming less power than when both DPD circuits perform non-zero distortion).

Figure 5:
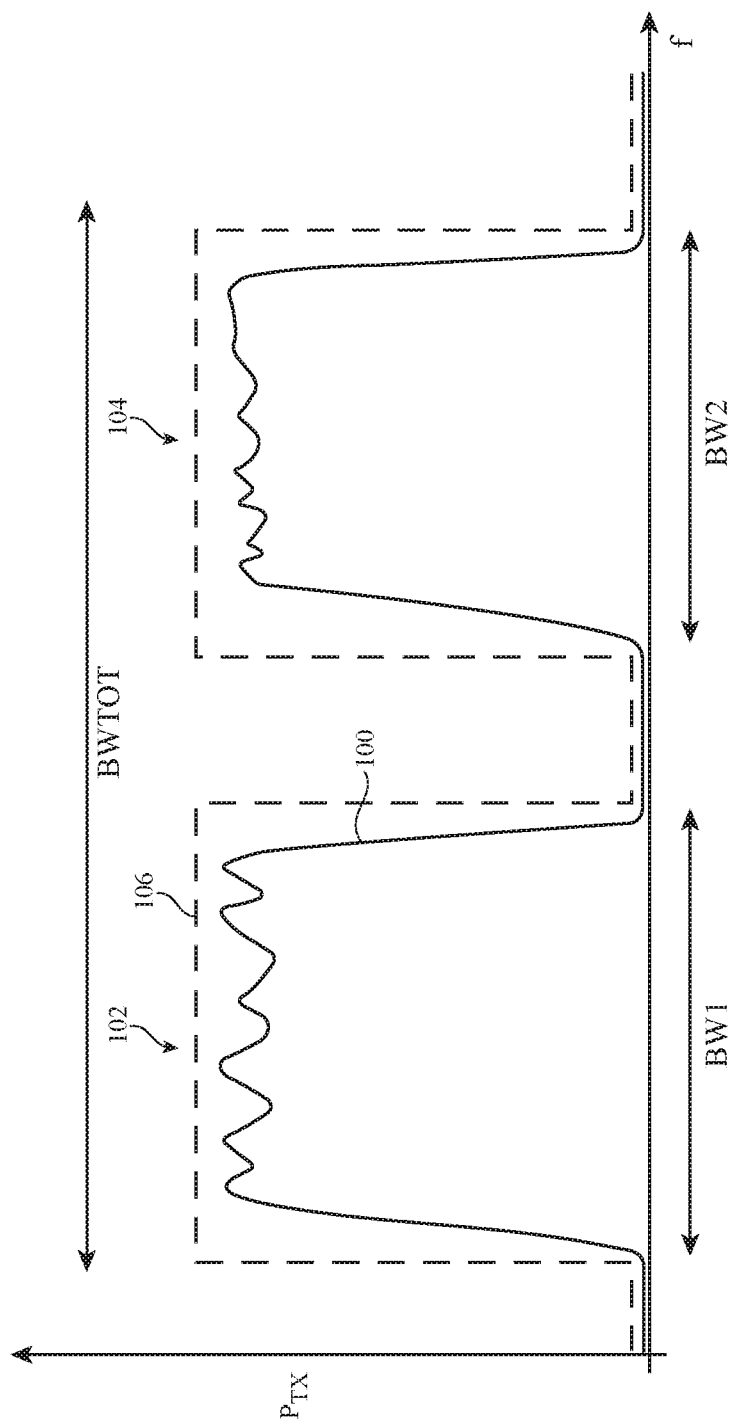
FIG. 5 is an exemplary diagram showing how two illustrative digital predistortion circuits may handle different fixed bandwidth portions of a total signal bandwidth in accordance with an embodiment.

FIG. 5 is an illustrative plot showing the frequency response of DPD circuits 20 and 28. As shown in FIG. 5, curve 100 shows the signal power $P_{TX}$ of the output of adder 34 (e.g., signal MTX) as a function of frequency. Portion 102 of curve 100 may correspond to the frequency of the $P_{CELL}$ transmit chain whereas portion 104 of curve 100 corresponds to the frequency of the $S_{CELL}$ transmit chain. The bandwidth of signal 100 is given by total bandwidth BWTOT. Total bandwidth BWTOT may be, for example, 40 MHz.

Curve 106 may represent the frequency response of DPD circuits 20 and 28. Portion 102 of curve 106 may represent the frequency response of DPD circuit 20 whereas portion 104 of curve 106 represents the frequency response of DPD circuit 28. The portion 102 of curve 106 associated with first DPD circuit 20 may have a corresponding fixed bandwidth BW1 (e.g., 20 MHz), whereas the portion 104 of curve 106 associated with second DPD circuit 28 may have a corresponding fixed bandwidth BW2 (e.g., 20 MHz). One of DPD circuits 20 and 28 may apply no predistortion to its bandwidth contribution BW1 to the combined signal 100 whereas the other DPD circuit may apply non-zero predistortion to its bandwidth contribution BW2 to the combined signal 100, the combination of which approximates predistortion that would be applied by a single DPD circuit across the total bandwidth BWTOT of combined signal 100.

Figure 6:
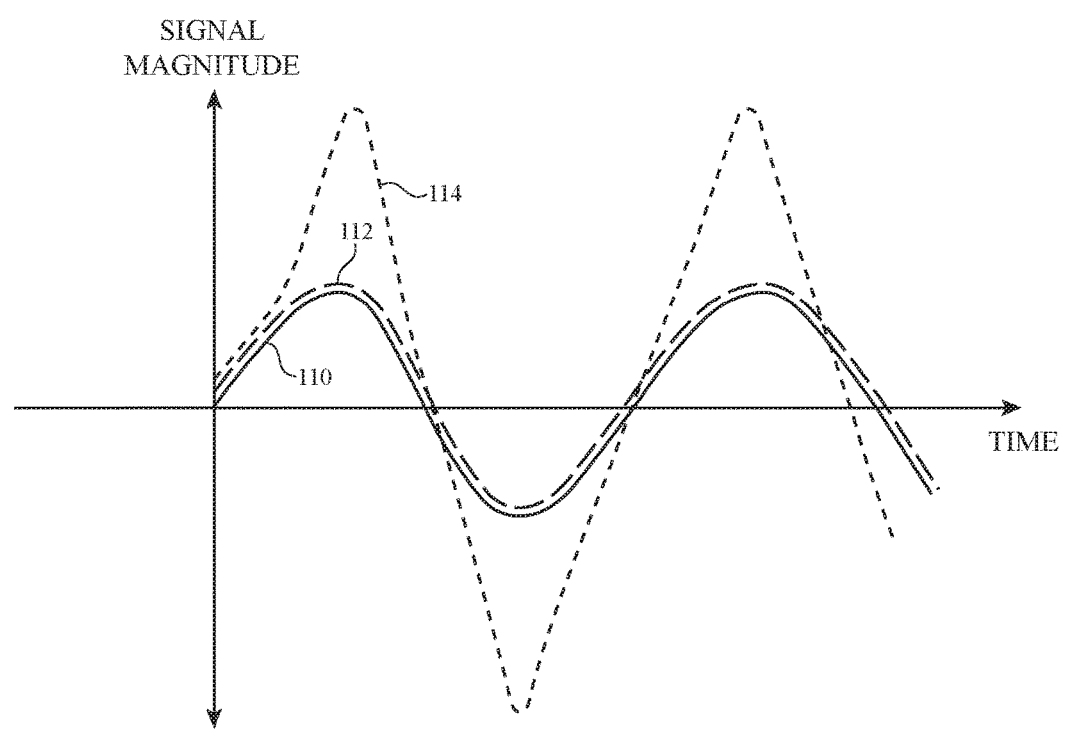
FIG. 6 is an exemplary time domain diagram showing how an illustrative digital predistortion circuit may provide no predistortion or different amounts of non-zero predistortion to an input signal in accordance with an embodiment.

FIG. 6 is an illustrative plot showing how DPD circuits 20 and 28 may provide different amounts of predistortion to signals $P_{CELL}$ and $S_{CELL}$. As shown in FIG. 6, curve 110 shows signal magnitude as a function of time of a given one of input signals $P_{CELL}$ or $S_{CELL}$. Curve 112 shows the output of the DPD circuit when providing no predistortion to the signal. Curve 112 may be generated, for example, by applying unity DPD coefficients (e.g., DPD coefficients of "1") to input signal 110. Curve 114 shows the output of the DPD circuit when providing non-zero predistortion (e.g., overdistortion) to the signal. Curve 114 may be generated, for example, by applying non-zero DPD coefficients to input signal 110.

Figure 7:
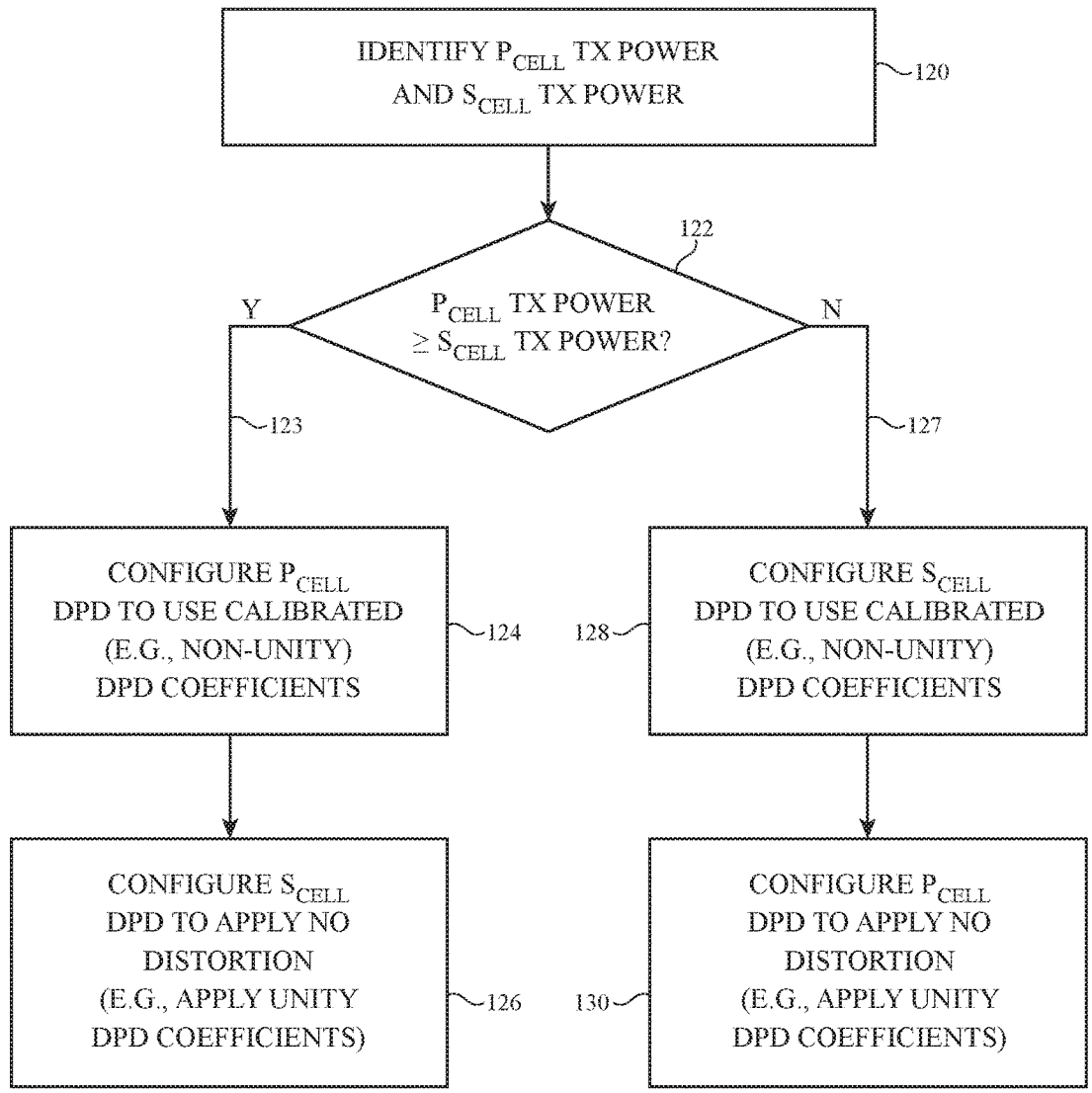
FIG. 7 is a flow chart of illustrative steps that may be performed by processing circuitry to perform predistortion on a first transmit chain without performing any distortion on a second transmit chain to cover a full output signal bandwidth using two predistortion circuits having lesser, fixed bandwidths in accordance with an embodiment.

In order to determine which of DPD circuits 20 and 28 to set for providing no predistortion (or for providing non-zero predistortion), device 10 may compare the transmit power levels identified for signals $P_{CELL}$ and $S_{CELL}$. In one suitable arrangement, circuitry 46 may configure the transmit chain having the greater power level to use non-unity DPD coefficients. FIG. 7 is a flow chart of illustrative steps that may be performed by device 10 for configuring DPD circuits 20 and 28 for transmitting predistorted signals at fixed bandwidths (e.g., based on stored calibration data 68). The steps of FIG. 7 may, for example, be performed by processing circuitry 46 and/or processing circuitry 64 of FIG. 1.

At step 120, processing circuitry 46 may identify the transmit power level PCELLTX at which baseband processor 18 is to transmit signals $P_{CELL}$ to DPD circuitry 20. Processor 46 may identify the desired transmit power level based on stored communications data, based on instructions received from external equipment such as a base station, etc. Similarly, circuitry 46 may identify the transmit power level SCELLTX at which baseband processor 26 is to transmit signals $S_{CELL}$ to DPD circuitry 28. Processor 46 may identify the desired transmit power level based on stored communications data, based on instructions received from external equipment such as a base station, etc.

At step 122, storage and processing circuitry 46 may compare PCELLTX to SCELLTX to determine which of PCELLTX and SCELLTX has a greater magnitude. If the magnitude of PCELLTX is greater than or equal to the magnitude of SCELLTX, processing may proceed to step 124 as shown by path 123.

At step 124, DPD processing circuitry 64 may configure first DPD circuitry 20 to apply calibrated (e.g., non-unity) DPD coefficient values to corresponding signals $P_{CELL}$ (e.g., signals $P_{CELL}$ transmitted by circuitry 18 at the identified transmit power level PCELLTX). For example, DPD processing circuitry 64 may provide a portion of stored calibration data 68 that identifies the non-unity DPD coefficient values to use to DPD circuitry 20. DPD circuitry 20 may load the received DPD coefficient values as AMAM coefficients 48 and AMPM coefficients 50.

At step 126, DPD processing circuitry 64 may configure second DPD circuitry 28 to not apply any predistortion to signals $S_{CELL}$. For example, circuitry 64 may instruct second DPD circuitry 28 to apply unity DPD coefficient values to corresponding signals $S_{CELL}$ (e.g., signals $S_{CELL}$ transmitted by circuitry 26 at the identified transmit power level SCELLTX). DPD circuitry 28 may load a value of unity as AMAM coefficient value 52 and as AMPM coefficient value 54. If the magnitude of PCELLTX is less than the magnitude of SCELLTX, processing may proceed to step 128 as shown by path 127.

At step 128, DPD processing circuitry 64 may configure second DPD circuitry 28 to apply calibrated (e.g., non-unity) DPD coefficient values to corresponding signals $S_{CELL}$ (e.g., signals $S_{CELL}$ transmitted by circuitry 26 at the identified transmit power level SCELLTX). For example, DPD processing circuitry 64 may provide a portion of stored calibration data 68 that identifies the non-unity DPD coefficient values to use to DPD circuitry 28. DPD circuitry 28 may load the received DPD coefficient values as AMAM coefficients 52 and AMPM coefficients 54.

At step 130, DPD processing circuitry 64 may configure first DPD circuitry 20 to not apply any predistortion to signals $P_{CELL}$. For example, circuitry 64 may instruct first DPD circuitry 20 to apply unity DPD coefficient values to corresponding signals $P_{CELL}$ (e.g., signals $P_{CELL}$ transmitted by circuitry 18 at the identified transmit power level PCELLTX). DPD circuitry 20 may load a value of unity as AMAM coefficient value 48 and as AMPM coefficient value 50.

Figure 8:
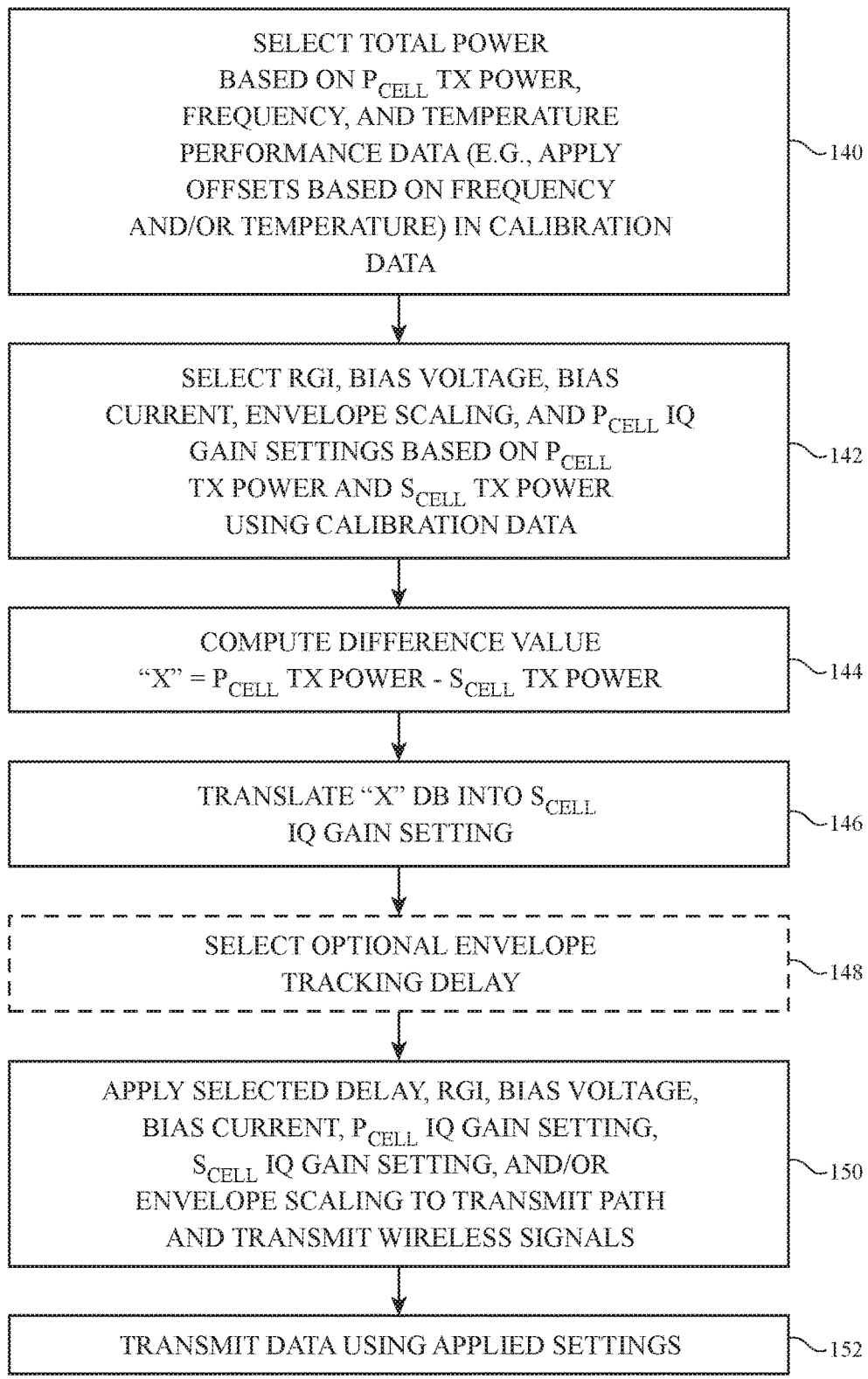
FIG. 8 is a flow chart of illustrative steps that may be performed by wireless communications circuitry for transmitting uplink signals using settings identified by stored calibration data in accordance with an embodiment.

FIG. 8 is a flow chart of illustrative steps that may be performed by processing circuitry 46 and/or DPD processing circuitry 64 for configuring wireless communications circuitry 12 for transmission using stored calibration data 68. The steps of FIG. 8 may, for example, be performed when PCELLTX is greater than or equal to SCELLTX and subsequent to step 126 of FIG. 7. This is merely illustrative and, if desired, the steps of FIG. 8 may be modified to be performed when SCELLTX is greater than PCELLTX and subsequent to step 130 of FIG. 7.

At step 140, circuitry 46 may determine a total $P_{CELL}$ power based on power level PCELLTX, frequency, and temperature performance data and based on calibration data 68. For example, circuitry 46 may compute the total power by adding a frequency compensation offset and a linearity compensation offset to power level PCELLTX. The offsets may be determined based on stored calibration data 68.

At step 142, circuitry 46 may select an RGI, bias voltage, bias current, envelope scaling setting, and/or $P_{CELL}$ IQ gain setting based on the determined total $P_{CELL}$ power, the identified power level SCELLTX, and using the calibration data. The envelope scaling setting may be an adjustable signal multiplier applied to each transmit chain prior to the corresponding DPD circuit (e.g., the envelope scaling setting may include a $P_{CELL}$ scaling setting and an $S_{CELL}$ scaling setting). For example, circuitry 46 may select the RGI, bias voltage, bias current, envelope scaling setting, and $P_{CELL}$ IQ gain setting from a given entry in calibration data 68 that corresponds to the identified total $P_{CELL}$ power and the identified power level value SCELLTX.

At step 144, circuitry 46 may compute a difference value X by subtracting power level SCELLTX from power level PCELLTX. Difference value X may be a power level in decibels (dB), for example. Value X may be an IQ gain back off setting, for example.

At step 146, circuitry 46 may translate or convert difference value X from a power level in dB to an IQ gain setting for $S_{CELL}$ gain circuit 32.

At optional step 148, circuitry 46 may select an optional envelope tracking delay to be provided by envelope tracking circuitry 70. For example, circuitry 46 may select the envelope tracking delay based on a given entry in calibration data 68 that corresponds to the identified total $P_{CELL}$ power and the identified power level SCELLTX.

At step 150, circuitry 46 and/or circuitry 64 may apply the settings identified in steps 140-148 to wireless communications circuitry 12. For example, circuitry 64 may configure amplifiers 40 to exhibit the selected RGI, may provide bias voltage Vcc at the selected bias voltage level to amplifiers 40, may provide the selected bias current to amplifiers 40, may provide the selected IQ gain settings to $P_{CELL}$ IQ gain circuit 24, and may control circuitry 12 to provide the selected envelope scaling to the transmit path (e.g., as selected while processing step 142). Similarly, circuitry 64 may provide the computed $S_{CELL}$ IQ gain settings to IQ gain circuit 32 (e.g., as computed at step 146) and may control envelope tracking circuitry 70 to perform the selected amount of optional delay (e.g., as determined at step 148). Circuitry 46 may identify the DPD coefficients to use during step 126 of FIG. 7 based on calibration data 68 (e.g., DPD coefficients from an entry in data 68 corresponding to the total $P_{CELL}$ and power level SCELLTX).

At step 152, circuitry 34 may transmit signals using the selected settings (e.g., the selected settings as applied at step 150). The transmitted signals may satisfy linearity requirements without consuming excessive power.

FIG. 9 is a diagram showing exemplary calibration data such as calibration data 68 that may be used in configuring wireless circuitry 12 for transmission using a constrained transmit bandwidth. As shown in FIG. 9, calibration data 68 may be arranged in a table or data structure having multiple entries (rows) that each corresponding to a pair of $P_{CELL}$ and $S_{CELL}$ transmit powers (e.g., values PCELLTX and SCELLTX). Data structure 68 may, for example, be generated while calibrating device 10 in a calibration or manufacturing system (e.g., prior to operation of device 10 by an end user). Data structure 68 may be processed (e.g., the entries of structure 68 may be used) during normal operation of device 10 such as while processing the steps of FIGS. 7 and 8 (e.g., during operation by an end user).

Each entry of table 68 may include corresponding RGI, bias voltage, bias current, $P_{CELL}$ IQ gain, $S_{CELL}$ IQ gain, $P_{CELL}$ envelope scaling, $S_{CELL}$ envelope scaling, $P_{CELL}$ transmit power (PCELLTX), $S_{CELL}$ transmit power (SCELLTX), and DPD coefficient settings (e.g., DPD coefficient settings D1, D2, D3, etc. that each include respective AMAM and AMPM coefficient values). While processing step 142 of FIG. 8, circuitry 64 may identify the entry of table 68 that corresponds to the identified PCELLTX and SCELLTX (e.g., as identified at step 120 of FIG. 7) and may identify the corresponding settings of that entry to use for uplink transmission. Circuitry 64 may process the information in table 68 (e.g., while processing steps 144 and 146) for configuring wireless circuitry 12 if desired. If desired, circuitry 64 may use the total $P_{CELL}$ power (e.g., as adjusted using offset values while processing step 140) to identify a corresponding entry (e.g., by using the identified $P_{CELL}$ total power value in place of the PCELLTX value). The example of FIG. 9 is merely illustrative. Other tuning knobs or metrics may be included in the columns of data 68. Some of the columns of data 68 may be omitted. Additional columns may be added to data 68.

In the example of FIG. 9, calibration data 68 corresponds to data used for performing uplink transmission when the identified PCELLTX is greater than or equal to the identified SCELLTX. An additional data structure or table may be stored as calibration data in non-volatile memory for use when SCELLTX is greater than PCELLTX. Other additional calibration data structures may be stored if desired.

FIG. 10 is a diagram showing how calibration data 68 may include power offset data for calibrating performance of circuitry 12 across different frequency bands. Each entry (row) of data structure 200 shown in FIG. 10 may correspond to a respective entry (row) of data structure 68 shown in FIG. 9. Each column may identify a power offset to use when settings from the corresponding entry of FIG. 9 is used, based on the frequency band that is being used for transmission (e.g., a first band BAND1, a second band BAND2, an Mth band BANDM, etc.). For example, if circuitry 12 is transmitting data in a first frequency band BAND1 using the calibration settings of the second row of FIG. 9, a power offset of −3 dBm may be identified in calibration data 200. This power offset may be used for determining total power while processing step 140 (e.g., by adding −3 dBm to the identified PCELLTX power level). Data structure 200 may, for example, be generated while calibrating device 10 in a calibration or manufacturing system (e.g., prior to operation of device 10 by an end user). Similar calibration data may be generated and stored to calibrate linearity across frequency and/or to calibrate for device temperature variations during normal operation. If desired, delay calibration may be performed to ensure that the output signals Tx are properly synchronized to the output of adder 34 across each frequency band.

Figure 11:
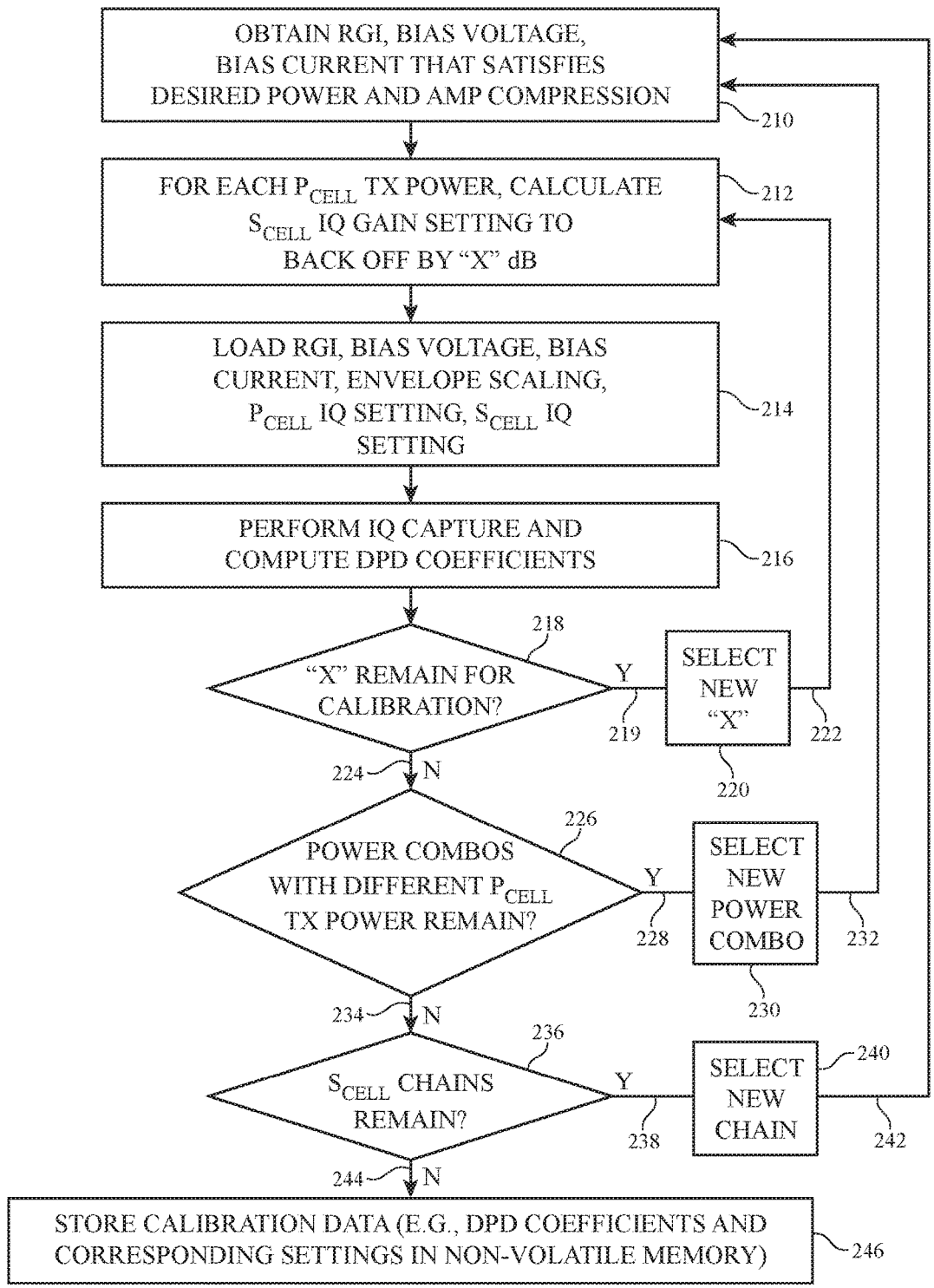
FIG. 11 is a flow chart of illustrative steps that may be performed by processing circuitry to generate calibration data of the type shown in FIG. 9 in accordance with an embodiment.

FIG. 11 is a flow chart of illustrative steps that may be performed by device 10 for generating calibration data 68. The steps of FIG. 11 may, for example, be performed by processing circuitry 46 and/or 64 while device 10 is placed in a calibration system (e.g., during device test or manufacture prior to use by an end user). The calibration system may include calibration equipment such as external wireless hardware for sending or receiving radio-frequency signals to device 10 and may include computing equipment such as a host computing device. The steps of FIG. 11 may be performed by processing circuitry 46 and 64 on device 10 and/or external calibration equipment.

At step 210, processing circuitry 46 may identify RGI, bias voltage, and bias current settings that satisfy a desired power level and amplifier compression. The identified values may be, for example, the minimum bias and RGI settings that can be used such that a desired amplifier compression level and power level are still met (e.g., to conserve power use). This may be performed by characterizing the device over a number of different RGI and bias settings in a calibration system and selecting the minimum settings that still satisfy desired power level and compression, for example.

At step 212, for each $P_{CELL}$ transmit power level PCELLTX, circuitry 46 may calculate an $S_{CELL}$ IQ gain setting to back off by "X" dB (e.g., by subtracting SCELLTX from PCELLTX).

At step 214, circuitry 46 may load (apply) the RGI and bias settings (e.g., as identified at step 210), may apply the computed $S_{CELL}$ IQ gain setting (as computed at step 212), and may apply a desired $P_{CELL}$ IQ gain setting and envelope scaling settings.

At step 216, wireless circuitry 12 may perform an IQ capture to compute DPD coefficients while the transmission settings are applied. For example, circuitry 12 may transmit signals using the applied settings, may capture transmitted signals TX via coupler 62, may compare the captured signals TX to the output MTX of adder 34, and may compute DPD coefficients based on the captured signals TX and the output MTX of adder 34.

At step 218, circuitry 46 may determine whether additional $S_{CELL}$ IQ gain back off settings X remain for processing. If settings X remain, processing may proceed to step 220 as shown by path 219. At step 220, circuitry 46 may select a new back off setting X. Processing may loop back to step 212 as shown by path 222 to generate additional calibration data.

If no back off settings X remain, processing may proceed to step 226 as shown by path 224. At step 226, circuitry 46 may determine whether additional combinations of $S_{CELL}$ and $P_{CELL}$ powers (e.g., with a different $P_{CELL}$ transmit power level PCELLTX) remain for processing. If additional combinations remain, processing may proceed to step 230 as shown by path 228. At step 230, circuitry 24 may select a new combination of power levels. Processing may loop back to step 210 to generate additional calibration data.

Additional transmit chains other than chains 14 and 16 may, if desired, be coupled to adder 34. If no additional power combinations remain, processing may proceed to step 236 as shown by path 234. At step 236, circuitry 46 may determine whether additional transmit chains remain for processing. If additional chains remain, processing may proceed to step 240 as shown by path 238. At step 240, circuitry 46 may select a new transmit chain for processing. Processing may subsequently loop back to step 210 as shown by path 242 to generate additional calibration data.

If no additional transmit chains remain for characterization, processing may proceed to step 246 as shown by path 244. At step 246, circuitry 46 may store the gathered data as a portion of calibration data 68. For example, the DPD coefficients computed at step 216 and the corresponding RGI, bias, envelope scaling, and IQ gain settings that were used to generate those DPD coefficients may be stored as a single entry (row) in calibration data 68 (e.g., as shown in FIG. 9). In this way, device 10 may populate calibration data 68 for use during normal device operation. By using the settings of calibration data 68 including application of non-unity DPD coefficients on one of the transmit chains and application of unity DPD coefficients on the other transmit chain, device 10 may reduce overall power consumption in the device while covering a larger total bandwidth (e.g., 40 MHz) using two fixed, smaller bandwidth (e.g., 20 MHz) DPD circuits on each of the transmit chains.

Figure 12:
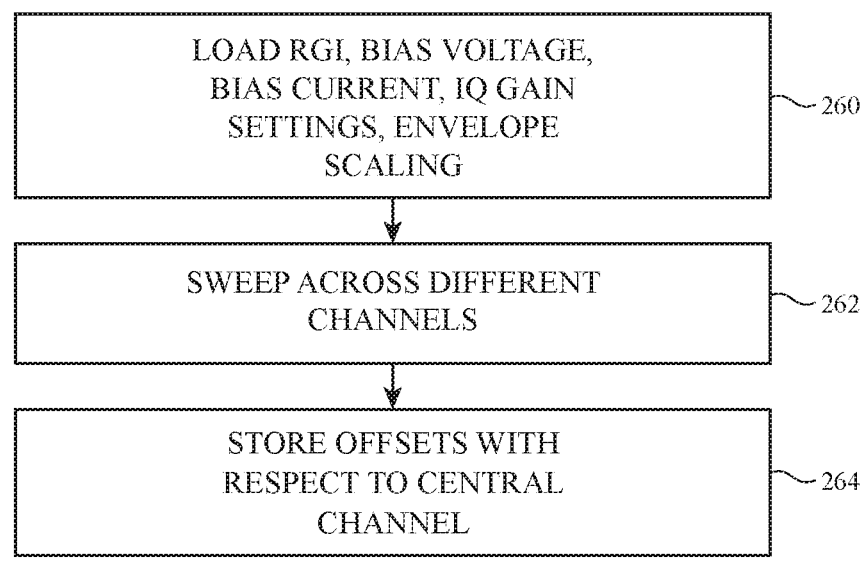
FIG. 12 is a flow chart of illustrative steps that may be performed by processing circuitry to generate calibration data of the type shown in FIG. 10 in accordance with an embodiment.

FIG. 12 is a flow chart of illustrative steps that may be performed in generating power offset values for use in performing the steps of FIG. 8. The steps of FIG. 12 may, for example, be performed to generate offset values such as those shown in FIG. 10.

At step 260, circuitry 46 may load RGI, bias, IQ gain, and envelop scaling settings to use and may apply the settings to wireless circuitry 12.

At step 262, device 10 may sweep across different frequency channels using the loaded settings and may gather data at each of the frequency channels. Circuitry 46 may compare the data gathered in each of the channels to determine offsets to use to compensate for variations in performance across different frequencies. The offsets may be computed by, for example, computing difference values between the data gathered at each of the frequency channels.

At step 264, circuitry 46 may store the generated offsets as a portion of calibration data 68 (e.g., as data structure 200 as shown in FIG. 10).

The example of FIGS. 1-12 in which $P_{CELL}$ and $S_{CELL}$ transmit signals are provided to DPD circuits 20 and 28 for performing carrier aggregation is merely illustrative. In general, signals $P_{CELL}$ and $S_{CELL}$ may be any desired signals at different frequencies. Any desired number of transmit chains and secondary base stations may be used.

During normal device operation, external equipment or other circuitry may instruct baseband processors 18 and 26 to adjust power levels PCELLTX and SCELLTX in real time. If SCELLTX is changed to a magnitude that is greater than PCELLTX, DPD circuits 20 and 28 may update the corresponding DPD coefficients (e.g., using calibration data 68) to correspond to the updated power levels PCELLTX and SCELLTX. For example, $S_{CELL}$ DPD circuit 28 may load non-unity DPD coefficients whereas $P_{CELL}$ DPD circuit 20 loads unity DPD coefficients (e.g., DPD circuit 28 performs distortion whereas DPD circuit 20 does not perform any distortion). In this way, a given one of circuits 20 and 28 will always be operated without distorting the corresponding transmit signals while the other circuit applies non-zero distortion to the corresponding transmit signals.

As an example, the transfer function of amplifier circuitry 40 may be represented as "H." In practice, H may be linear for a first range of input powers (e.g., below a power level $P_1^*$ as shown in FIG. 3) and nonlinear above that range of input powers. In the nonlinear domain, the transfer function may be given by $P_1^* + 0.25(1-\exp(-\alpha^*(I-P_1^*)))$, where $\alpha$ is a constant and I is the variable input power level. In the linear domain, the transfer function may be given by the linear equation $a^*I+b$ where a is a slope value and b is a y-intercept value (e.g., a and b are constants).

In traditional carrier aggregation schemes, where $P_{CELL}$ is added to $S_{CELL}$ prior to inputting the added signal to DPD circuitry coupled to the input of the amplifier, the transfer function of the DPD circuitry is equivalent to 1/H (i.e., the DPD coefficients provide the DPD circuitry with a transfer function equal to the inverse of the transfer function of the amplifier). The magnitude of the signals input to the DPD circuitry is thereby given by (PCELLTX+SCELLTX) and the magnitude of the predistorted signals output by the DPD and at the input of the amplifier is given by (PCELLTX+SCELLTX)/H. In a scenario where PCELLTX is approximately equal to SCELLTX (e.g., at a magnitude T), the magnitude of the signals at the output of the DPD circuit and the input of the amplifier are given by 2T/H.

In the arrangement of FIGS. 1-12 having two parallel transmit chains, one of the DPD circuits may be provided with a transfer function of unity (e.g., the unity DPD coefficients may provide that DPD circuit with a unity transfer function). As an example, the DPD coefficients may set the transfer function of DPD circuitry 28 (FIG. 2) to unity (1). The magnitude of the signal output by DPD circuitry 28 may therefore be given by SCELLTX*1=SCELLTX. The transfer function of the other DPD circuit (e.g., DPD circuit 20) may be set to (2−H)/H, for example (e.g., the DPD coefficients applied by circuitry 20 may provide DPD circuitry 20 with the transfer function (2−H)/H). The magnitude of the signal output by DPD circuitry 20 may therefore be given by PCELLTX*(2−H)/H. The signals from chains 14 and 16 may be added at adder 34 to generate a signal having a magnitude given by SCELLTX+PCELLTX*(2−H)/H. In a scenario where PCELLTX is approximately equal to SCELLTX and to a magnitude T, the magnitude of the signal output by adder 34 is given by T+T*(2−H)/H=T+2T/H−T=2T/H. This is the same as the scenario where the two streams are added prior to being input to the DPD circuitry and thus, the added signal output by adder 34 may properly compensate for the non-linear transfer function H of amplifier 40 when conveyed through amplifier 40 in a similar manner, but with less total power consumption.

In other words, setting the non-unity predistortion coefficients so that the non-unity DPD circuit provides a transfer function of (2−H)/H may allow for proper compensation for nonlinearity of amplifier 40 across the entire bandwidth of interest and without consuming excessive power in the system. If desired, in one suitable arrangement, control circuitry 46 and 64 may control circuitry 20 and 28 (e.g., using corresponding DPD coefficients) so that one of circuitry 20 and 28 provides a unity transfer function and so that the other of circuitry 20 and 28 provides a transfer function of (2−H)/H. This example is merely illustrative and, in general, any desired non-unity transfer function may be applied by one of circuits 20 and 28.

The foregoing is merely illustrative of the principles of this invention and various modifications can be made by those skilled in the art without departing from the scope and spirit of the invention. The foregoing embodiments may be implemented individually or in any combination.

What is claimed is:

1. Wireless communications circuitry, comprising:
   a first digital predistortion circuit that receives a first signal at a first frequency and that is configured to perform predistortion operations on the first signal using a set of non-unity predistortion coefficients to generate a predistorted signal;
   a second digital predistortion circuit that receives a second signal at a second frequency that is different from the first frequency and that is configured to apply a unity predistortion coefficient to the second signal to generate an undistorted signal;
   adder circuitry that is configured to combine the predistorted signal and the undistorted signal to generate a combined signal; and
   radio-frequency amplifier circuitry that is configured to amplify the combined signal to generate an amplified signal.

2. The wireless communications circuitry defined in claim 1, further comprising:
   storage and processing circuitry that maintains calibration data, wherein the calibration data comprises the set of non-unity predistortion coefficients, and the storage and processing circuitry is configured to load the non-unity predistortion coefficients onto the first digital predistortion circuit.

3. The wireless circuitry defined in claim 1, further comprising:
   a rotator circuit that is coupled between the first digital predistortion circuit and the adder circuitry and that is configured to adjust a phase of the predistorted signal.

4. The wireless circuitry defined in claim 3, further comprising:
   envelope tracking circuitry having an input coupled to a circuit node between the first digital predistortion circuit and the rotator circuit and having an output that provides an adjustable bias voltage to the radio-frequency amplifier circuitry.

5. The wireless circuitry defined in claim 3, further comprising:
   gain circuitry coupled between the rotator circuit and the adder circuitry, wherein the gain circuitry is configured to adjust an in-phase quadrature phase (IQ) gain of the predistorted signal.

6. The wireless circuitry defined in claim 5, further comprising:
   an additional rotator circuit that is coupled between the second digital predistortion circuit and the adder circuitry and that is configured to adjust a phase of the undistorted signal; and
   additional gain circuitry coupled between the additional rotator circuit and the adder circuitry, wherein the additional gain circuitry is configured to adjust an in-phase quadrature phase (IQ) gain of the undistorted signal.

7. The wireless circuitry defined in claim 1, further comprising:
   up-conversion circuitry coupled between the adder circuitry and the radio-frequency amplifier circuitry, wherein the up-conversion circuitry is configured to convert the combined signal to a radio-frequency; and
   a digital-to-analog converter coupled between the up-conversion circuitry and an input of the radio-frequency amplifier circuitry, wherein the digital-to-analog converter is configured to convert the combined signal from a digital domain to an analog domain.

8. The wireless circuitry defined in claim 1, further comprising:
   an antenna;
   a radio-frequency coupler coupled between the antenna and the radio-frequency amplifier circuitry; and
   predistortion processing circuitry that receives the amplified signal over the radio-frequency coupler, wherein the predistortion processing circuitry is configured to generate the set of non-unity predistortion coefficients based at least on the amplified signal received over the radio-frequency coupler.

9. The wireless circuitry defined in claim 8, wherein the radio-frequency amplifier circuitry is characterized by a transfer function H and the set of non-unity predistortion coefficients control the first digital predistortion circuit to apply a predistortion transfer function equal (2−H) divided by H to the first signal.

10. The wireless circuitry defined in claim 8, wherein the predistortion processing circuitry is configured to control the first digital predistortion circuit to apply the unity predistortion coefficient to the first signal and the predistortion processing circuitry is configured to control the second digital predistortion circuit to perform the predistortion operations on the second signal using the set of non-unity predistortion coefficients.

11. A method for operating an electronic device having first and second predistortion circuits, first and second baseband processors, an adder, an amplifier, and an antenna, the method comprising:
   with the first predistortion circuit, receiving a first signal from the first baseband processor and generating a predistorted signal by applying a first set of non-unity predistortion coefficients to the first signal;
   with the second predistortion circuit, receiving a second signal from the second baseband processor and generating an undistorted signal by applying a unity predistortion coefficient to the second signal;
   with the adder, generating an added signal by adding the predistorted signal generated by the first predistortion circuit to the undistorted signal generated by the second predistortion circuit;
   with the amplifier, amplifying the added signal to generate a transmit signal; and
   with the antenna, transmitting the transmit signal.

12. The method defined in claim 11, further comprising:
with processing circuitry on the electronic device, identifying a first power level of the first signal and a second power level of the second signal;
with the processing circuitry, generating a total power level by adding an offset value to the first power level;
with the processing circuitry, identifying settings for the amplifier based on the total power level and the second power level; and
with the processing circuitry, controlling the amplifier based on the identified settings.

13. The method defined in claim 12, wherein the processing circuitry stores calibration data having a plurality of calibration data entries, wherein identifying the settings comprises:
identifying a given calibration data entry in the plurality of calibration data entries corresponding to the total power level and the second power level;
identifying the settings for the amplifier from the identified given calibration data entry;
with the processing circuitry, performing calibration operations to generate the plurality of calibration data entries; and
with the processing circuitry, storing the generated plurality of calibration data entries in non-volatile memory on the electronic device.

14. The method defined in claim 12, wherein the electronic device comprises envelope tracking circuitry coupled between the first predistortion circuit and the amplifier and identifying the settings for the amplifier comprises:
identifying an envelope tracking delay for the envelope tracking circuitry based on the total power level and the second power level.

15. The method defined in claim 12, wherein identifying the settings for the amplifier comprises identifying, based on the total power level and the second power level, a setting selected from the group consisting of: a bias voltage setting, a bias current setting, an envelope scaling setting, and a radio-frequency gain index setting.

16. The method defined in claim 11, the method further comprising:
with processing circuitry in the electronic device, identifying a first power level of the first signal and a second power level of the second signal;
with the processing circuitry, determining whether the first power level is greater than the second power level;
in response to determining that the first power level is greater than the second power level, controlling the first predistortion circuit to generate the predistorted signal by providing the first set of non-unity predistortion coefficients to the first predistortion circuit and controlling the second predistortion circuit to generate the undistorted signal by providing the unity predistortion coefficient to the second predistortion circuit; and
in response to determining that the first power level is less than the second power level, controlling the second predistortion circuit to generate the predistorted signal by providing the first set of non-unity predistortion coefficients to the second predistortion circuit and controlling the first predistortion circuit to generate the undistorted signal by providing the unity predistortion coefficient to the first predistortion circuit.

17. The method defined in claim 11, wherein the amplifier is characterized by an amplifier transfer function, generating the predistorted signal by applying the first set of non-unity predistortion coefficients to the first signal comprises applying a predistortion circuit transfer function to the first signal, the predistortion transfer function is equal to a quantity divided by the amplifier transfer function, and the quantity is equal to two minus the amplifier transfer function.

18. An electronic device, comprising:
first digital predistortion circuitry in a first transmit chain;
second digital predistortion circuitry in a second transmit chain;
baseband circuitry coupled to the first and second transmit chains, wherein the baseband circuitry is configured to convert a data stream into a first signal at a first frequency and a second signal at a second frequency that is different from the first frequency, and the baseband circuitry is configured to concurrently provide the first signal to the first digital predistortion circuitry and the second signal to the second digital predistortion circuitry;
adder circuitry coupled between the first and second transmit chains, wherein the first digital predistortion circuitry generates a distorted signal by applying non-unity predistortion coefficients to the first signal, the second digital predistortion circuitry generates an undistorted signal based on the second signal, and the adder circuitry generates an added signal by combining the distorted signal and the undistorted signal;
amplifier circuitry that is configured to generate an amplified signal by amplifying the added signal; and
an antenna that is configured to transmit the amplified signal.

19. The electronic device defined in claim 18, further comprising:
processing circuitry that stores calibration data, wherein the calibration data identifies the non-unity predistortion coefficients; and
a radio-frequency coupler coupled between the antenna and the amplifier circuitry, wherein the processing circuitry receives the amplified signal over the radio-frequency coupler and is configured to generate the non-unity predistortion coefficients based at least on the received amplified signal.

20. The electronic device defined in claim 18, wherein the first digital predistortion circuitry applies the non-unity predistortion coefficients to the first signal over a first fixed signal bandwidth, the second digital predistortion circuitry generates the undistorted signal by applying a unity predistortion coefficient to the second signal over a second fixed signal bandwidth, and the amplified signal has a third bandwidth that is greater than the first fixed signal bandwidth and that is greater than the second fixed signal bandwidth.

* * * * *